US010490607B2

(12) United States Patent
Zheng et al.

(10) Patent No.: US 10,490,607 B2
(45) Date of Patent: Nov. 26, 2019

(54) PROFILED DISPLAY PANEL AND DISPLAY DEVICE

(71) Applicant: XIAMEN TIANMA MICRO-ELECTRONICS CO., LTD., Xiamen (CN)

(72) Inventors: Binyi Zheng, Xiamen (CN); Yan Yang, Xiamen (CN); Yongping Zeng, Xiamen (CN); Ling Wu, Xiamen (CN); Boping Shen, Xiamen (CN)

(73) Assignee: XIAMEN TIANMA MICRO-ELECTRONICS CO., LTD., Xiamen (CN)

( * ) Notice: Subject to any disclaimer, the term of this patent is extended or adjusted under 35 U.S.C. 154(b) by 0 days.

(21) Appl. No.: 16/134,988

(22) Filed: Sep. 19, 2018

(65) Prior Publication Data

US 2019/0019849 A1   Jan. 17, 2019

(30) Foreign Application Priority Data

Sep. 19, 2017   (CN) .......................... 2017 1 0848488

(51) Int. Cl.
*H01L 27/32* (2006.01)
*G02F 1/1343* (2006.01)

(52) U.S. Cl.
CPC .... *H01L 27/3218* (2013.01); *G02F 1/134336* (2013.01)

(58) Field of Classification Search
None
See application file for complete search history.

(56) References Cited

U.S. PATENT DOCUMENTS

| | | | | | |
|---|---|---|---|---|---|
| 2017/0125448 | A1* | 5/2017 | Park | ..................... | H01L 51/5284 |
| 2017/0192313 | A1* | 7/2017 | Long | ..................... | G02F 1/015 |
| 2017/0330500 | A1* | 11/2017 | Yoon | ..................... | G09G 3/2003 |
| 2018/0337217 | A1* | 11/2018 | Zang | ..................... | H01L 27/322 |
| 2018/0374401 | A1* | 12/2018 | Yang | ..................... | G09G 3/3611 |

FOREIGN PATENT DOCUMENTS

| | | |
|---|---|---|
| CN | 105514134 A | 4/2016 |
| CN | 105629596 A | 6/2016 |

* cited by examiner

*Primary Examiner* — Benjamin P Sandvik
(74) *Attorney, Agent, or Firm* — Kilpatrick Townsend & Stockton, LLP (57) ABSTRACT

A profiled display panel and a display device are provided. A display region of the profiled display panel has a profiled border. The profiled display panel includes a plurality of pixels including low-brightness pixels and regular pixels. Brightness of the low-brightness pixels is lower than brightness of the regular pixels under same driving voltage. The plurality of pixels forms a plurality of pixel rows extending in first direction and a plurality of pixel columns extending in second direction. Each of the pixel rows or the pixel columns includes at least one pixel group including the low-brightness pixels at one end of the pixel group and the regular pixels at the other end, and the regular pixels are arranged away from the profiled border. An aperture area of the respective low-brightness pixels in same pixel group is gradually increased in direction from the profiled border to the display region.

13 Claims, 6 Drawing Sheets

PROFILED DISPLAY PANEL AND DISPLAY DEVICE

CROSS-REFERENCE TO RELATED APPLICATIONS

The present disclosure claims priority to Chinese Patent Application No. 201710848488.7, filed on Sep. 19, 2017, the content of which is incorporated herein by reference in its entirety.

TECHNICAL FIELD

The present disclosure relates to the field of semiconductor technologies, and particularly, to a profiled display panel and a display device.

BACKGROUND

With the application of display technology in intelligent wear and other portable electronic devices, there has been a diversified demand for the appearance of the display panel, and then a profiled display panel appears accordingly.

Compared with the conventional display panel, the main difference of the profiled display panel lies in that its display region presents a non-rectangular special shape, such as a circle, a ring, a diamond, etc., while the pixel units in the display panel are mostly rectangular structures or other relatively conventional structures. Therefore, when applied to the profiled display panel, the pixel unit and the profiled border line of the display panel cannot fully fit in the profiled border region near the display panel, which may cause the display region of the display panel near the profiled border to present jagged patterns, the pattern of the border position are not smooth, thereby affecting the display effect of the display region near the profiled border.

Therefore, there is a need to provide a profiled display panel and a display device to solve the urgent problem of the display jagging phenomenon in the profiled display panel.

SUMMARY

In view of the above, the present disclosure provides a profiled display panel and a display device, which can solve the above mentioned problem.

In order to solve the above technical problem, the present disclosure provides a profiled display panel, wherein the profiled display panel includes a display region having a profiled border, the profiled display panel includes a plurality of pixels including low-brightness pixels and regular pixels, and brightness of the low-brightness pixels is lower than brightness of the regular pixels under a same driving voltage, the plurality of pixels forms a plurality of pixel rows extending in a first direction and a plurality of pixel columns extending in a second direction, each of the pixel rows or the pixel columns includes at least one pixel group including the low-brightness pixels at one end of the pixel group and the regular pixels at the other end of the pixel group, and the regular pixels are arranged away from the profiled border, wherein the first direction intersects with the second direction; and wherein an aperture area of the low-brightness pixels in a same pixel group is gradually increased in a direction from the profiled border toward the display region.

In addition, in order to solve the above technical problem, the present disclosure provides a display device, including any display panel provided in the present disclosure.

Compared to the related art, the profiled display panel and display device provided by the present disclosure can achieve the following beneficial effects:

With the profiled display panel and the display device provided by the present disclosure, the profiled display panel includes low-brightness pixels and regular pixels, and the brightness of the low-brightness pixels is smaller than the brightness of the regular pixels. Arranging the low-brightness pixels in the display region near the profiled border alleviates the display jagging phenomenon at the profiled border. In a same pixel group according to the present embodiments, if the aperture areas of the respective low-brightness pixels in a same pixel group are gradually increased in the direction from the profiled border to the display region, the brightness of the low-brightness pixels is gradually increased, thereby realizing the gradual transition of the brightness from low to high in the direction from the profiled border to the display region, and there is no big difference in brightness in the display region when displaying.

BRIEF DESCRIPTION OF DRAWINGS

The accompanying drawings, which are incorporated in and constitute a part of the specification, illustrate embodiments of the present disclosure and, together with the description, serve to explain principles of the present disclosure.

DESCRIPTION OF EMBODIMENTS

Various exemplary embodiments of the present disclosure will be described in detail with reference to the accompanying drawings. It should be noted that relative arrangements of the components and steps, numerical expressions and numerical values set forth in the embodiments are not intended to limit the scope of the present disclosure, unless otherwise specified.

The following description for at least one exemplary embodiment is merely illustrative, and is in no way to limit the present disclosure and its application or use.

Techniques, methods and devices known to those skilled in the art may not be discussed in detail, but where appropriate, the techniques, methods and devices should be considered as part of the specification.

In all of the examples shown and discussed herein, any specific values are to be construed as illustrative only and not as a limitation. Thus, other examples of the exemplary embodiments may have different values.

It should be noted that similar reference numerals and letters indicate similar items in the following accompanying drawings, and therefore, once an item is defined in one drawing, it is not required to be further discussed in the subsequent accompanying drawings.

Figure 1:
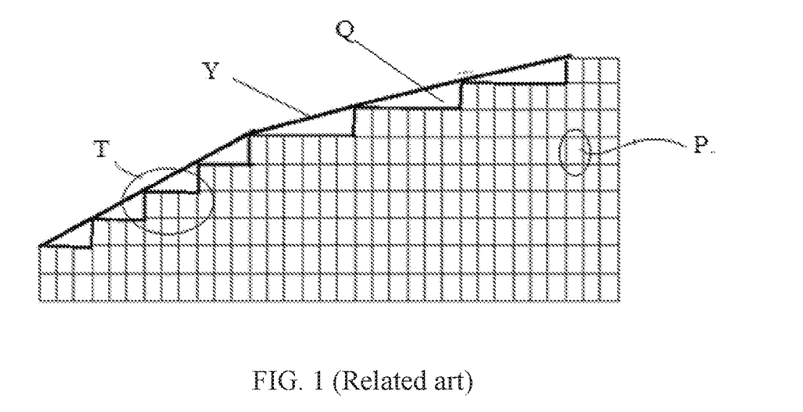
FIG. 1 is a schematic diagram of a part of pixels of a profiled display panel in the related art.

FIG. 1 is a schematic diagram of some pixels of a profiled display panel in the related art. As shown in FIG. 1, in order to fit a profiled border Y of the profile display panel, some pixels P near the profiled border Y is removed, causing the display region to form a plurality of step regions T near the profiled border Y. A region Q between the profiled border Y and the step region T cannot arrange a complete pixel and thus is blocked by a black matrix (BM). The pixels P located in the step region T are lighted when displaying, while the black matrix in the region Q is almost opaque and the brightness is zero. Therefore, the difference of the brightness between the step region T and the region Q is so large to form jagged patterns, and the pattern of the profiled border Y is not smooth during the display, affecting the display effect of the display panel. For example, a part of the display region of the display panel is hollowed to arrange a camera or a receiver, and the hollowed part is in a shape of a chamfered rectangle, a circle or an ellipse, etc., so that the display region has a profiled border. For another example, the display panel itself is a non-rectangular display panel such as a chamfered rectangular display panel, a circular display panel, or an annular display panel, in which the phenomenon of jagged patterns occurs.

With the profiled display panel provided by the present disclosure including low-brightness pixels and regular pixels, by designing and adjusting the aperture area in the pixels, the brightness of the low-brightness pixels being smaller than that of the regular pixels is achieved, the difference of brightness between the display region near the profiled border and the profiled border is reduced, the jagged phenomenon of the display panel is alleviated. The profiled display panel provided by the present disclosure can be applied to a liquid crystal display panel or an organic light emitting display panel.

Figure 2:
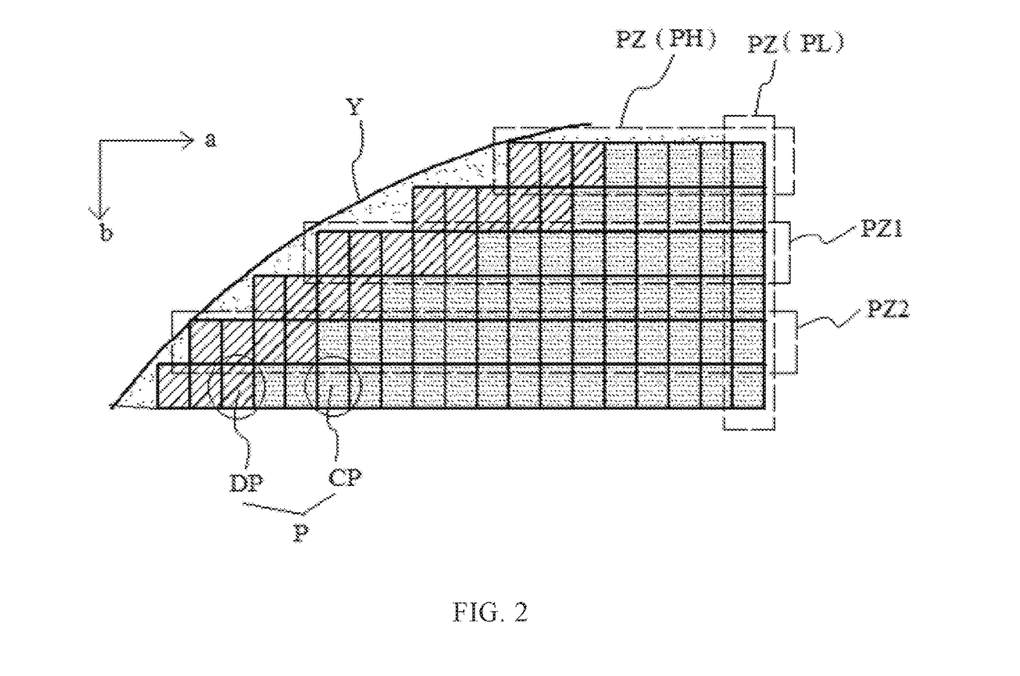
FIG. 2 is a top view of a profiled display panel according to an embodiment of the present disclosure.

FIG. 2 is a top view of a profiled display panel according to an embodiment of the present disclosure. As shown in FIG. 2, a display region of the profiled display panel has a profiled border Y. The profiled display panel includes a plurality of pixels P, and the pixels P include low-brightness pixels DP and regular pixels CP. The brightness of the low-brightness pixel DP is smaller than the brightness of the regular pixel CP under a same driving voltage. The plurality of pixels P form a plurality of pixel rows PH extending in the first direction a and a plurality of pixel columns PL in the second direction b. The first direction a intersects with the second direction b. The pixel row PH or the pixel column PL includes a pixel group PZ. The pixel group PZ serves as a part of the pixel row PH or the pixel column PL, and includes the low-brightness pixel DP at one end of the pixel group PZ and the regular pixel CP at the other end of the pixel group PZ. The regular pixel CP is arranged away from the profiled border Y. The present disclosure does not limit the number of pixels in the pixel group PZ. The regular pixel CP is arranged away from the profiled border Y compared to the low-brightness pixel DP. The space region between the profiled border Y and the low-brightness pixel DP is almost opacity and the brightness is zero. The brightness of the low-brightness pixel DP is lower than that of the regular pixel CP. Compared with the conventional display panel, the difference of the brightness between the display region near the profiled border Y and the brightness of the profiled border Y is reduced, thereby alleviating the phenomenon of jagged display at the profiled edge. In order to achieve a gradual smooth transition of the brightness, in the pixel group PZ including the low-brightness pixel DP, the number of low-brightness pixels DP may be larger than the number of pixels adjacent to the profiled border Y, that is, there are low-brightness pixels DP not being adjacent to the profiled border Y in the display panel.

As shown in FIG. 2, the pixel group PZ includes a first pixel group PZ1 and a second pixel group PZ2. The number of pixels P adjacent to the profiled border Y in the first pixel group PZ1 is greater than the number of pixels P adjacent to the profiled border Y in the second pixel group PZ2. The number of the low-brightness pixels DP in the first pixel group PZ1 is greater than or equal to the number of the low-brightness pixels DP in the second pixel group PZ2. In the present disclosure. The greater the number of pixels P adjacent to the profiled border Y in the pixel group PZ is, the greater the number of low-brightness pixels DP in the pixel group PZ will be. Preferably, the number of low-brightness pixels DP in one pixel group is greater than or equal to the number of the pixel P adjacent to the profiled border Y. The border shape displayed in the display region near the profiled border Y is closer to the shape of the profiled border Y, which alleviates the phenomenon of the jagged border during the display. Meanwhile, if the aperture area of the respective low-brightness pixel in a same pixel group gradually increases in the direction from the profiled border to the display region, a gradual transition of brightness from low to high in the direction from the profiled border to the display region is achieved, the display jagging phenomenon at the profiled border is alleviated, and the display region may not have a significant difference in brightness.

Figure 3:
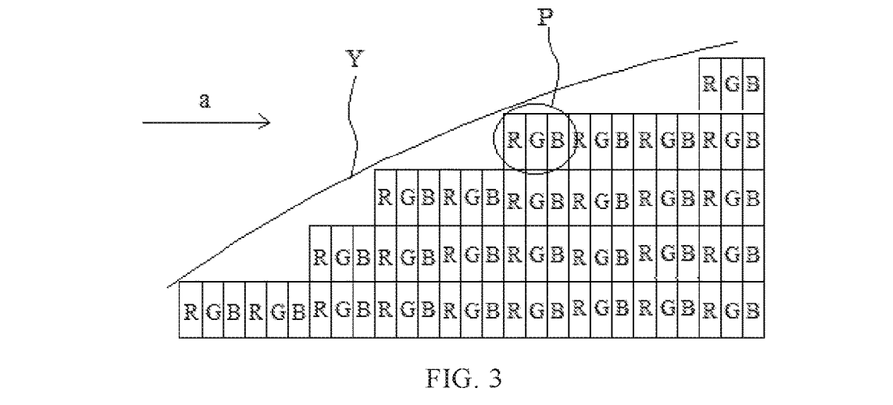
FIG. 3 is a top view of a profiled display panel according to another embodiment of the present disclosure.

Further, in some optional embodiments, in a pixel group including low-brightness pixels, the regular pixels are arranged away from the profiled border, and each of the low-brightness pixel and the regular pixel includes at least three sub-pixels having different colors sequentially arranged in the first direction. The aperture areas of the respective sub-pixels in a same pixel are the same. FIG. 3 is a top view of a profiled display panel according to another embodiment of the present disclosure. As shown in FIG. 3, taking the pixel P includes three sub-pixels having R (red), G (green) and B (blue) colors arranged in the first direction a as an example, the aperture areas of the respective sub-pixels in a same pixel are the same. When the display panel is displaying, the sub-pixels having different colors are mixed to form a single pixel to present a final displayed color. If the aperture areas of the respective sub-pixels in a same pixel are the same, and the overall chromaticity of the display panel is uniform when it is displaying. In the profiled display panel according to the present disclosure, the display jagging phenomenon at the profiled border Y is alleviated, and there is no chromaticity abnormality problem near the profiled border, thereby enhancing the overall display effect of the profiled display panel.

Figure 4:
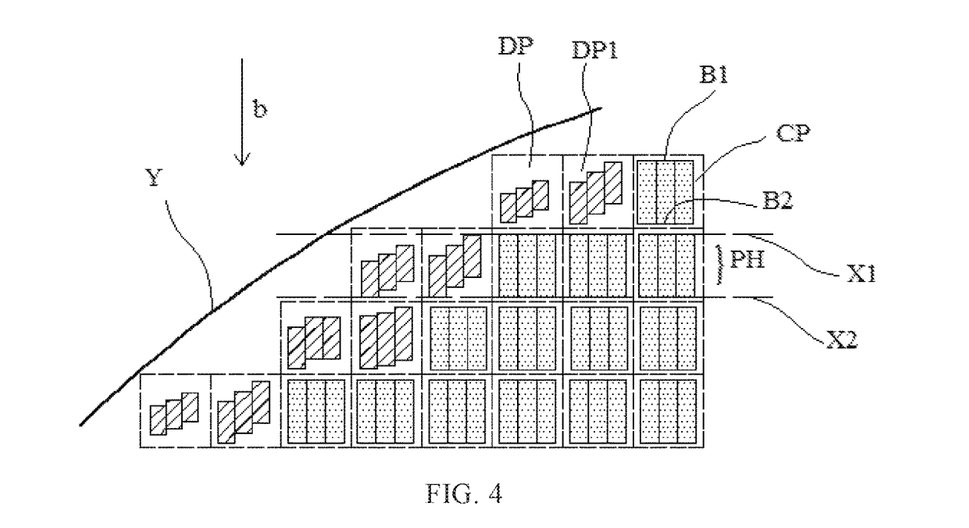
FIG. 4 is a top view of a profiled display panel according to another embodiment of the present disclosure.

Further, in some optional embodiments, FIG. 4 is a top view of a profiled display panel according to another embodiment of the present disclosure. As shown in FIG. 4, in the profiled display panel according to the embodiments of the present disclosure, taking one pixel includes three sub-pixels having different colors as an example, the aperture shape of the sub-pixel is a rectangle, and the aperture of the sub-pixel has a first edge B1 and a second edge B2 arranged opposite to each other in the second direction b. In the second direction b, the first edge B1 is closer to the profiled border Y than the second edge B2. In a same pixel row PH, the first edges B1 of the sub-pixels in each of the regular pixels CP are all in a first straight line X1 and the second edges B2 are all in a second straight line X2. At least one first edge B1 of the sub-pixels in the respective low-brightness pixel DP is not in the first straight line X1, and/or, at least one second edge B2 of the sub-pixels in the respective low-brightness pixel DP is not in the second straight line X2.

With the profiled display panel according to the embodiments of the present disclosure, the first or the second edge of the respective sub-pixels in the low-brightness pixel DP may be located in a same straight line, or the first and the second edge of the respective sub-pixels in the low-brightness pixel DP as shown in FIG. 4 are all not in a same straight line. In the embodiments, the position of the aperture of the sub-pixel in the low-brightness pixel can be designed according to the orientation of the profiled border, and the border shape displayed by the display region near the profiled border Y is closer to the shape of the profiled border Y when the display panel is displaying, thus alleviating the border jagging phenomenon during the display.

It should be noted that the positional relationships between the first edge B1 and the second edge B2, between the first straight line X1, the second straight line X2 and the sub-pixels are shown in FIG. 4, and the part relating to the first edge B1, the second edge B2, the first straight line X1, and the second straight line X2 in all embodiments of the present disclosure can be referred to the positional relations as shown in FIG. 4.

Figure 5:
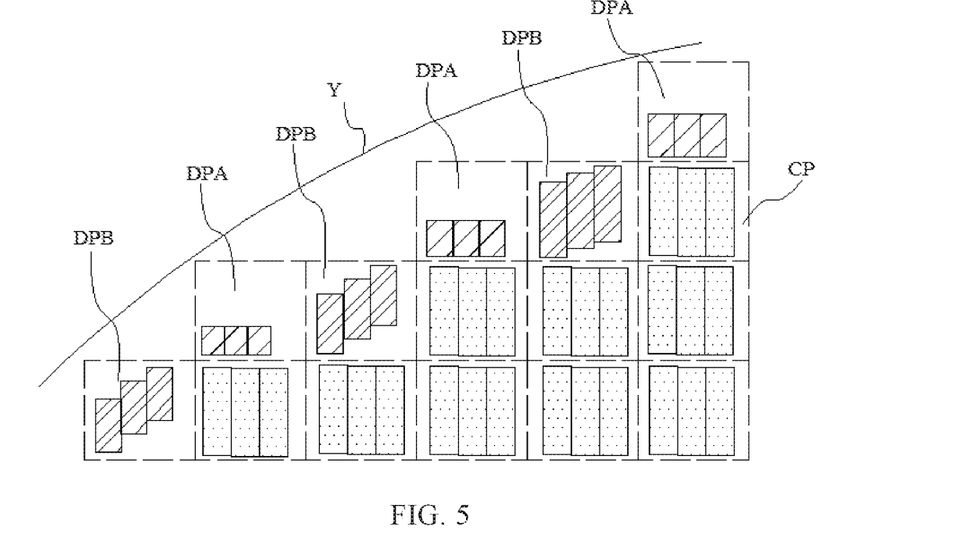
FIG. 5 is a schematic diagram of a profiled display panel according to another embodiment of the present disclosure.

Further, in some optional embodiments, FIG. 5 is a schematic diagram of a profiled display panel according to another embodiment of the present disclosure. As shown in FIG. 5, the low-brightness pixel near the profiled border Y includes a first low-brightness pixel DPA and a second low-brightness pixel DPB. Under a same driving voltage, the brightness of the first low-brightness pixel DPA is greater than 0 and less than a half of the brightness of a regular pixel CP, and the brightness of the second low-brightness pixel DPB is greater than or equal to a half of the brightness of the regular pixel CP. In the profiled display panel according to the embodiments, the low-brightness pixels include first low-brightness pixels and second low-brightness pixels, and different brightness of the low-brightness pixel is set at the display region near the profiled border according to different brightness requirements in order to adapt the orientation of the profiled border. The border shape displayed by the display region near the profiled border Y is closer to the shape of the profiled border Y when the display panel is displaying, thus alleviating the border jagging phenomenon during the display.

Further, in some optional embodiments, the distance between the first edge of the respective sub-pixels in the first low-brightness pixel and the second straight line is smaller than the distance between the first straight line and the second straight line. That is, the aperture height of the respective sub-pixels in the first low-brightness pixel in the second direction is smaller than the height of the aperture of the regular pixel in the second direction. The distances between the first edges of the respective sub-pixels in the first low-brightness pixel and the second straight line may be the same or different, and the first low-brightness pixels according to embodiments include various cases.

In some optional embodiments, the first low-brightness pixel is adjacent to the profiled border, and the brightness of the first low-brightness pixel is greater than 0 and less than a half of the brightness of the regular pixel, thus the difference between the brightness of the first low-brightness pixel when lighted and the brightness of the opaque region of the profiled border is small, which can effectively alleviating the border jagging phenomenon during the display.

Figure 6:
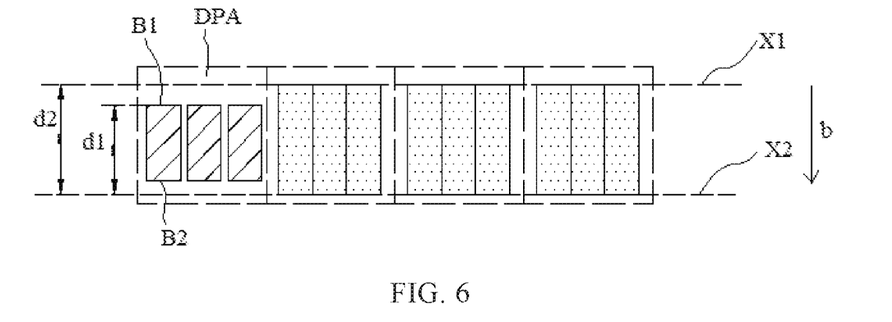
FIG. 6 is a schematic diagram of a profiled display panel including a pixel row of a first low-brightness pixel according to an embodiment of the present disclosure.

In an embodiment, FIG. 6 is a schematic diagram of a profiled display panel including a pixel row of first low-brightness pixel according to an embodiment of the present disclosure. As shown in FIG. 6, the distance d1 between the first edge B1 of the respective sub-pixels in the first low-brightness pixel DPA and the second straight line X2 is smaller than the distance d2 between the first straight line X1 and the second straight line X2. The first edges B1 of the respective sub-pixels in the first low-brightness pixel DPA are in a same straight line, and the second edges B2 of the respective sub-pixels in the first low-brightness pixel are in a same straight line, that is, the aperture heights of the respective sub-pixels in a same first low-brightness pixel DPA in the second direction b are the same. In the embodiments, the aperture heights of the respective sub-pixels in a first low-brightness pixel are the same, and there is no chromaticity difference when the first low-brightness pixel is lighted and the brightness region is concentrated.

Figure 7:
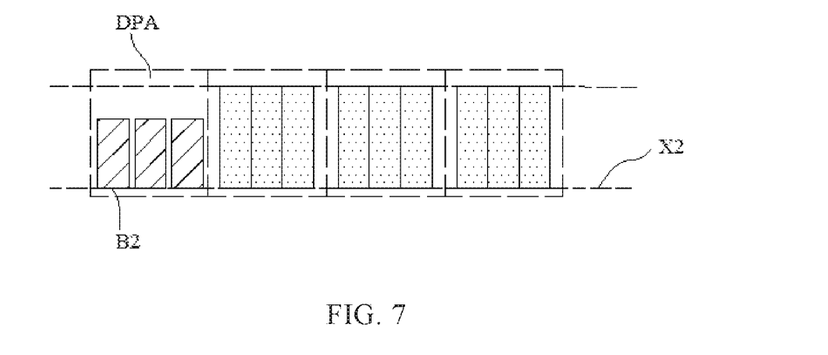
FIG. 7 is a schematic diagram of a profiled display panel including a pixel row of a first low-brightness pixel according to another embodiment of the present disclosure.

In another embodiment. FIG. 7 is a schematic diagram of a profiled display panel including a pixel row of a first low-brightness pixel according to another embodiment of the present disclosure. As shown in FIG. 7, the second edge B2 of the sub-pixel in the first low-brightness pixel DPA is in the second straight line X2. In the embodiments, the aperture of the first low-brightness pixel is closer to the display region than to the profiled border, and the arrangement of the first low-brightness pixel is adapted to the orientation of the profiled border, while the apertures of the display region near the profiled border are concentrated, and the brightness difference in the brightness transition region during the display is small, and the display effect is good.

Figure 8:
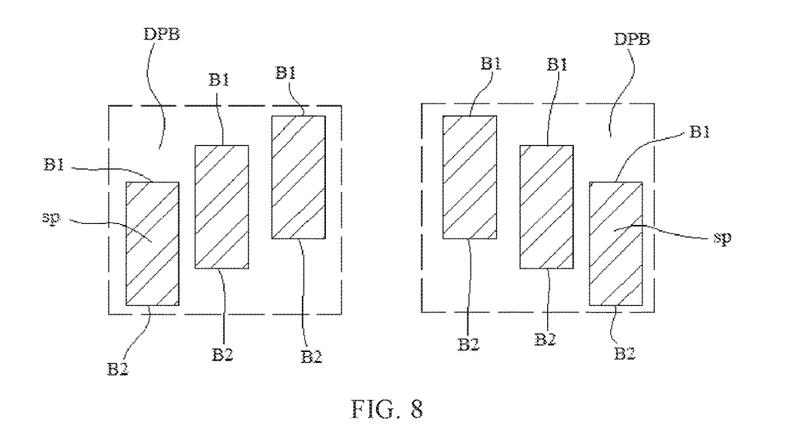
FIG. 8 is a schematic diagram of a second low-brightness pixel of a profiled display panel according to an embodiment of the present disclosure.

Further, in some optional embodiments, FIG. 8 is a schematic diagram of a second low-brightness pixel of a profiled display panel according to an embodiment of the present disclosure. As shown in FIG. 8, the first edges B1 of any two sub-pixels sp in the second low-brightness pixel DPB are not in a same straight line, and the second edges B2 of any two sub-pixels sp in the second low-brightness pixel are not in a same straight line. FIG. 8 only shows two kinds of arrangement of the sub-pixels in the second low-brightness pixel. In the embodiments, the sub-pixels in the second low-brightness pixel may have multiple manners of misaligned arrangement, which can adapt to different border orientations of the profiled border. The border shape displayed by the display region near the profiled border Y is closer to the shape of the profiled border Y when the display panel is displaying, thus alleviating the border jagging phenomenon during the display.

Further, a rectangular coordinate system is established on the plane in which the profiled display panel is located, a first direction from the profiled border to the display region is the x-axis direction of the rectangular coordinate system, and the direction perpendicular to the first direction is the y-axis direction.

Figure 9:
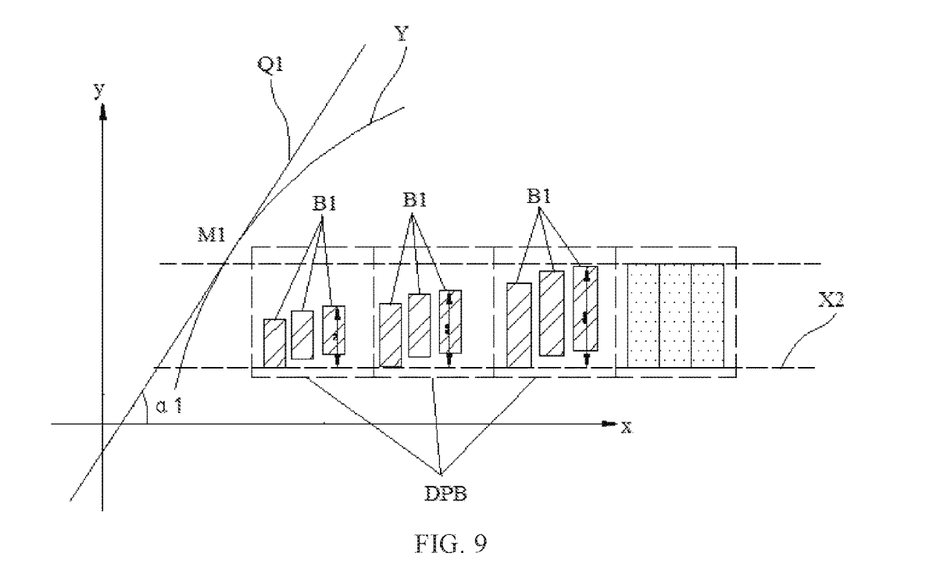
FIG. 9 is a schematic diagram showing an arrangement of sub-pixels in a second low-brightness pixel of a profiled display panel according to an embodiment of the present disclosure.

In some optional embodiments, FIG. 9 is a schematic diagram showing an arrangement of the sub-pixels in a second low-brightness pixel of a profiled display panel according to an embodiment of the present disclosure. As shown in FIG. 9, an included angle α1 between a tangent line Q1 of a point M1 on the curve at which the profiled border is located and the x-axis is an acute angle, the slope of the tangent line Q1 is greater than zero. The slope of any point of the curve of the profiled border Y shown in FIG. 9 is greater than zero. In the profiled display panel, the distance between the first edge B1 of the respective pixels of the second low-brightness pixel DPB and the second straight line X2 is sequentially increased. The brightness of the second low-brightness pixels DPB is then sequentially increased, thereby alleviating the display jagging phenomenon at the profiled border. Meanwhile, in the direction from the profiled border to the display region, the brightness gradually changes from low to high, and there is no significant difference in brightness when displaying, and the display effect is good.

Figure 10:
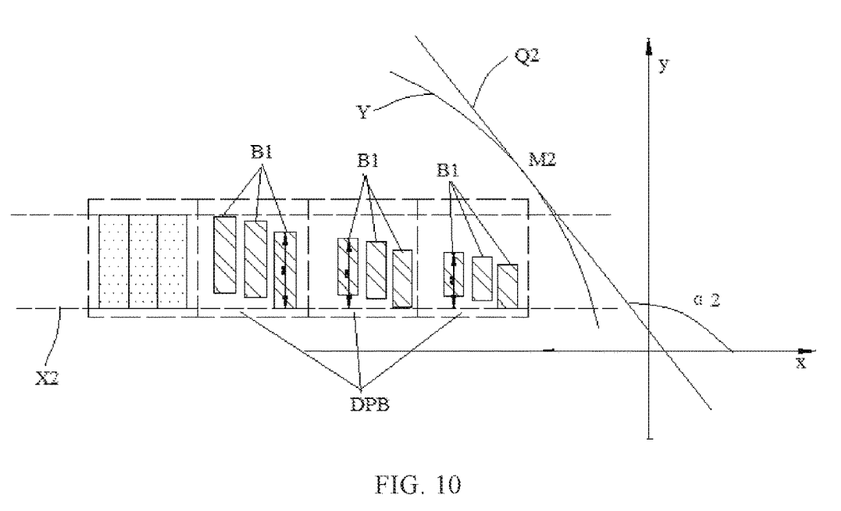
FIG. 10 is a schematic diagram showing an arrangement of sub-pixels in a second low-brightness pixel of a profiled display panel according to another embodiment of the present disclosure.

In some optional embodiments, FIG. 10 is a schematic diagram showing an arrangement of the sub-pixels in a second low-brightness pixel of a profiled display panel according to another embodiment of the present disclosure. As shown in FIG. 10, an included angle α2 between the tangent Q2 of a point M2 on the curve at which the profiled border Y is located and the x-axis is an obtuse angle, the slope of the tangent line Q2 is less than zero. The slope of any point of the curve of the profiled border Y shown in FIG. 10 is smaller than zero. In the profiled display panel, the distance between the first edge B1 of the respective pixels of the second low-brightness pixel DPB and the second straight line X2 is sequentially reduced. The brightness of the second low-brightness pixels DPB is then sequentially reduced, thereby alleviating the display jagging phenomenon at the profiled border. Meanwhile, the brightness of the second low-brightness pixel gradually changes, and there is no significant difference in brightness when displaying, and the display effect is good.

Figure 11:
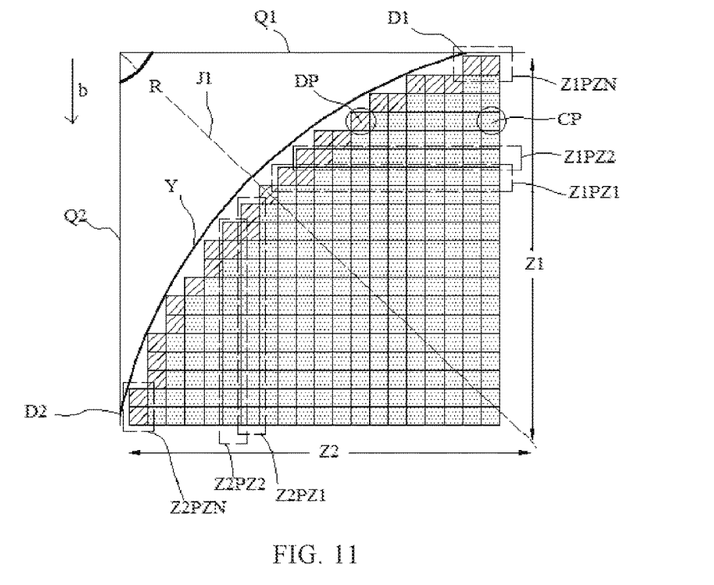
FIG. 11 is a top view of a profiled display panel according to another embodiment of the present disclosure.

Further, in some optional embodiments, FIG. 11 is a top view of a profiled display panel according to another embodiment of the present disclosure. As shown in FIG. 11, the profiled display panel includes low-brightness pixels DP and regular pixels CP. A profiled border Y is an arcuate border. The first tangent line Q1 of the arcuate border intersects with the second tangent line Q2 of the arcuate border to form an angle R toward the arcuate border. The first tangent line Q1 is a tangent line passing through a first end point D1 of the arcuate border, and the second tangent line Q2 is a tangent line passing through a second end point D2 of the arcuate border. A display region between an angle bisector J1 of the angle R and the first tangent line Q1 is a first region Z1. A display region between the angle bisector J1 of the angle R and the second tangent line Q2 is a second region Z2. In the first region Z1, each of the pixel groups is located in a same pixel row, and in the second region Z2, each of the pixel groups is located in a same pixel column. In a direction from the angle bisector J1 of the angle R to the first tangent line Q1, the first region Z1 includes a first pixel group Z1PZ1 of the first region, a second pixel group Z1PZ2 of the first region to an $N^{th}$ pixel group Z1PZN of the first region arranged sequentially. In a direction from the angular bisector J1 of the angle R to the second tangent line Q2, the second region Z2 includes a first pixel group Z2PZ1 of the second region, a second pixel group Z2PZ2 of the second region to an $N^{th}$ pixel group Z2PZN of the second region arranged sequentially. In a direction from the profiled border to the display region, the aperture areas of the respective pixels in an $X^{th}$ pixel group of the first region and in an $X^{th}$ pixel group of the second region are the same, wherein X is greater than or equal to 1 and less than or equal to N, and N is a positive integer. Only an arrangement manner of the pixels in the display panel is shown in FIG. 11, and the sub-pixels included in the pixel are not shown in FIG. 11.

In the embodiments, adjusting of the aperture area of the sub-pixel is realized by adjusting the height of the sub-pixels in the low-brightness pixel along the second direction b, thereby ensuring that the aperture area of the low-brightness pixel in a same pixel group is gradually increased in a direction from the profiled border to the display region. In the embodiments, the profiled border of the profiled display panel is an arcuate border, and the display region near the profiled border is designed with partitions. In a direction from the profiled border to the display region, the aperture areas of the respective pixels in an $X^{th}$ pixel group of the first region and in an $X^{th}$ pixel group of the second region are the same, that is, the brightness of the respective pixels in the $X^{th}$ pixel group of the first region and in the $X^{th}$ pixel group of the second region are the same accordingly. The shape of the border pattern of the display region near the profiled border during the display is closer to the shape of the arcuate border, which alleviates the display jagging phenomenon caused by the profiled border, and at the same time the transition manners of the pixel brightness in the two regions of the angle bisector of the angle R are the same, and the visual effect is good when the display panel is displaying.

Figure 12:
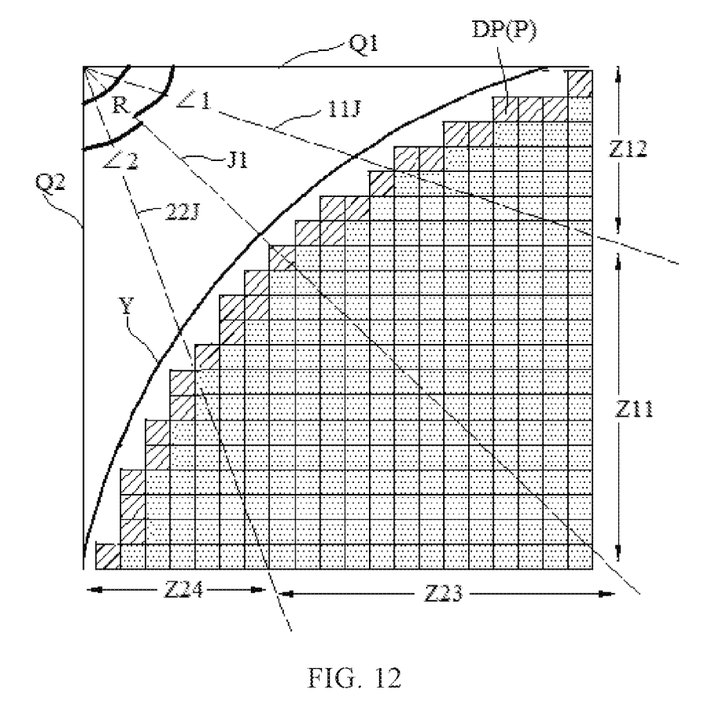
FIG. 12 is a top view of a profiled display panel according to another embodiment of the present disclosure.

Further, in some optional embodiments, FIG. 12 is a top view of a profiled display panel according to another embodiment of the present disclosure. As shown in FIG. 12, the angle bisector of the angle R divides the angle R into a first angle ∠1 with the first tangent line Q1 as an edge and a second angle ∠2 with the second tangent line Q2 as an edge. The angle bisector 11J of the first angle ∠1 divides the first region into a first sub-region Z11 near the angular bisector J1 of the angle R and a second sub-region Z12 near the first tangent line Q1, the number of the pixels P adjacent to the profiled border Y in the pixel group in the second sub-region Z12 is greater than or equal to the number of the pixels P adjacent to the profiled border Y in the pixel group in the first sub-region Z11. The angle bisector 22J of the second angle ∠2 divides the second region into a third sub-region Z23 near the angular bisector J1 of the angle R and a fourth sub-region Z24 near the second tangent line Q2, the number of the pixels P adjacent to the profiled border Y in the pixel group in the fourth sub-region Z24 is greater than or equal to the number of the pixels P adjacent to the profiled border Y in the pixel group in the third sub-region Z23.

In the embodiments, in the first sub-region Z11 and the third sub-region Z23 near the angle bisector J1 of the angle R, the arcuate shape of the profile border is more noticeable. If the number of pixels P in the pixel group adjacent to the profile border Y is less, the brightness transition of the profiled border is finer, the display jagging phenomenon caused by the profiled border is alleviated, and the presented border shape during the display is closer to an arcuate shape. The second sub-region Z12 and the fourth sub-region Z24 are respectively close to two end points near the profiled border. The border in the display panel connected with the two end points of the profiled border is a regular border, the visual arcuate extent at the profiled border is less noticeable than that in the first sub-region Z11 and the third sub-region Z23, and more pixels can be arranged adjacent to the profiled border.

Further, in some optional embodiments, as shown in FIG. 12, the number of pixels P adjacent to the profiled border Y in the pixel group in the first sub-region Z11 is less than or equal to 2, and the number of the low-brightness pixels DP in the pixel group in the first sub-region Z11 is less than or equal to 2. The number of pixels P adjacent to the profiled border Y in the pixel group in the second sub-region Z12 is greater than or equal to 2, and the number of low-brightness pixels DP in the pixel group in the second sub-region Z12 is greater than or equal to 2.

In the embodiments, in a pixel group including low-brightness pixels, the number of low-brightness pixels is greater than or equal to the number of pixels in the pixel group adjacent to the profiled border, which reduces the brightness difference between the display area and the profiled border, and alleviates the display jagging phenomenon.

Further, in some optional embodiments, as shown in FIG. 12, in the respective pixel group of the second sub-region Z12, the number of pixels P adjacent to the profiled border Y is equal to the number of the low-brightness pixels DP. In the pixel group of the second sub-region, the number of pixels adjacent to the profiled border is relatively large, and all the pixels adjacent to the profiled border are arranged as low-brightness pixels, therefore the display jagging phenomenon is alleviated, and at the same time the brightness of the low-brightness pixels is gradually increased in the direction from the profiled border to the display region, thereby realizing a uniform transition of the brightness and a good display effect of the display panel.

Further, in some optional embodiments, the difference of the gray scale between the low-brightness pixels having different brightness is an integer multiple of 16 in the profiled display panel provided by the present disclosure.

When the display panel is displaying, the brightness change from the darkest to the brightest has a total of 256 brightness levels from 0 to 255, which is called 256 gray scales. In the embodiments, 14 low-brightness pixels whose gray scales differ by an integer multiple of 16 are pre-designed by adjusting the aperture size of the pixel. The pixel with the lowest brightness in the low-brightness pixels is 15 grayscale, and the pixel with the highest brightness in the low-brightness pixels is 239 grayscale. The required low-brightness pixels arranged are selected according to the brightness requirement at a position adjacent to the profiled border. At this time, the aperture size of the pixel has been designed, thereby saving the time for re-designing the process. Designing the gray scale differing by an integer multiple of 32 only requires to design 6 low-brightness pixels. The number of low-brightness pixels of different brightness is too little to meet the different brightness requirements of adjacent pixels at the profiled border. Designing the gray scale differing by an integer multiple of 8 requires to design 30 low-brightness pixels. The number of low-brightness pixels with different brightness is relatively large and the design is relatively complicated. In the embodiments of the present disclosure, 14 kinds of low-brightness pixels with different brightness are designed, the design is relatively simple, and the more brightness changes of the low-brightness pixels can be realized at the same time.

It should be noted that the values of the difference in the gray scale between the low-brightness pixels with different brightness in the profiled display panel can be designed according to different brightness requirements. In the above embodiments, the case where the gray scales of the difference between the low-brightness pixels with different brightness being an integer multiple of 16 is an optional implementation and is not intended to limit the scope of the present disclosure.

Figure 13:
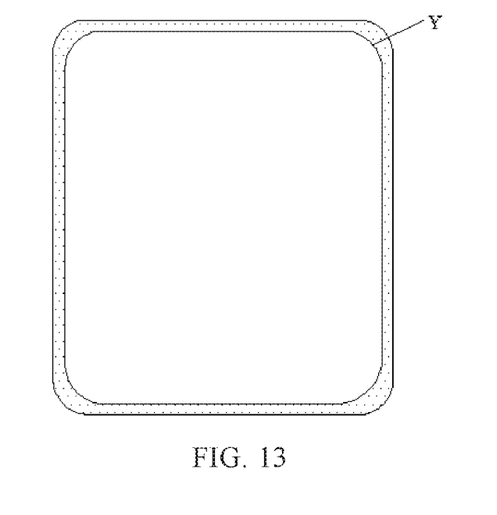
FIG. 13 is a top view of a display device according to an embodiment of the present disclosure.

Further, the present disclosure further provides a display device, including any of the profiled display panels provided by the embodiments of the present disclosure. FIG. 13 is a top view of a display device according to an embodiment of the present disclosure. As shown in FIG. 13, the display device includes a profiled display panel having an arcuate border Y. With the display device provided by the present disclosure, the profiled display panel includes low-brightness pixels and regular pixels, the low-brightness pixels are arranged in a display region near the profiled border, and the size of the aperture area of the pixel is adjusted to realize the different transmittance in the pixels. The brightness of the low-brightness pixel is smaller than that of the regular pixel, therefore the display jagging phenomenon of the profiled border is alleviated. Meanwhile, the brightness of the low-brightness pixel gradually increases in a direction from the profiled border to the display region, thereby realizing a gradual transition of the brightness from low to high in the direction from the profiled border to the display region.

It can be seen from the above embodiments that the profiled display panel and the display device of the present disclosure achieve the following beneficial effects:

With the profiled display panel and the display device provided by the present disclosure, the profiled display panel includes low-brightness pixels and regular pixels, and the brightness of the low-brightness pixels is smaller than the brightness of the regular pixels. Arranging the low-brightness pixels in the display region near the profiled border alleviates the display jagging phenomenon at the profiled border. In a same pixel group according to the present embodiments, if the aperture areas of the respective low-brightness pixels in a same pixel group are gradually increased in the direction from the profiled border to the display region, the brightness of the low-brightness pixels is gradually increased, thereby realizing the gradual transition of the brightness from low to high in the direction from the profiled border to the display region, and there is no big difference in brightness in the display region when displaying.

Although exemplary embodiments have been shown and described, it would be appreciated by those skilled in the art that the above embodiments cannot be construed to limit the present disclosure, and thus changes, alternatives, and modifications can be made in the embodiments without departing from the spirit, principles and scope of the present disclosure.

What is claimed is:

1. A profiled display panel, wherein the profiled display panel comprises a display region having a profiled border, the profiled display panel comprises a plurality of pixels comprising low-brightness pixels and regular pixels, and brightness of the low-brightness pixels is lower than brightness of the regular pixels under a same driving voltage, the plurality of pixels forms a plurality of pixel rows extending in a first direction and a plurality of pixel columns extending in a second direction, each of the pixel rows or the pixel columns comprises at least one pixel group comprising the low-brightness pixels at one end of the pixel group and the regular pixels at the other end of the pixel group, and the regular pixels are arranged away from the profiled border, wherein the first direction intersects with the second direction; and wherein an aperture area of the low-brightness pixels in a same pixel group is gradually increased in a direction from the profiled border toward the display region, each of the pixels comprises at least three sub-pixels having different colors arranged sequentially in the first direction; and aperture areas of the sub-pixels of a same pixel are identical, an aperture of the sub-pixel has a rectangular shape, and has a first edge and a second edge opposite to the first edge in the second direction, wherein in the second direction, the first edge is closer to the profiled border that the second edge; and in a same pixel row, the first edges of the sub-pixels in each of the regular pixels are in a first straight line and second edges of the sub-pixels in each of the regular pixels are in a second straight line, the first edge of the sub-pixels in at least one of the low-brightness pixels is not the first straight line, and/or, the second edge of the sub-pixels in at least one the low-brightness pixels is not in the straight line, the low-brightness pixel comprises a first low-brightness pixel and a second low-brightness pixel, wherein under a same driving voltage, brightness of the first low-brightness pixel is greater that 0 and less that a half of brightness of the regular pixel, and brightness of the second low-brightness pixel is greater than or equal to a half of the brightness of the regular pixel, wherein in the first direction from the profiled border toward the display region:

when a slope of a curve at which the profiled border is located is more that zero, a distance between the first edges of the sub-pixels of the second low-brightness pixel and the second straight line is reduced sequentially; and when a slope of the curve at which the profiled border is located is less than zero, the distance between the first edges of the sub-pixels of the second low-brightness pixel and the second straight line is reduced sequentially.

2. The profiled display panel according to claim 1, wherein a distance between the first edge of each of the sub-pixels in the first low-brightness pixel and the second straight line is less than a distance the first straight line and the second straight line.

3. The profiled display panel according to claim 2, wherein the first edges of sub-pixels in the first low-brightness pixel are in a same straight line, and the second edges of the sub-pixels in the first low-brightness pixel are in a same straight line.

4. The profiled display panel according to claim 3, wherein the second edges of the sub-pixels in the first low-brightness pixel are located in the second straight line.

5. The profiled display panel according to claim 2, wherein the first low-brightness pixel is adjacent to the profiled border.

6. The profiled display panel according to claim 1, wherein the first edges of any of the sub-pixels in the second low-brightness pixel are not in a same straight line, and the second edges of any two of the sub-pixels in the second low-brightness pixel are not in the same straight line.

7. The profiled display panel according to claim 1, wherein the profiled border is an arcuate border;

the arcuate border has a first tangent line and a second tangent line intersecting with the first tangent line to form an angle R toward the arcuate border, the first tangent line is a tangent line passing through a first end point of the arcuate border, and the second tangent line is a tangent line passing through a second end point of the arcuate border;

a display region between an angle bisector of the angle R and the first tangent line is a first region, and a display region between the angle bisector of the angle R and the second tangent line is a second region, wherein in the first region, one pixel group of the pixel groups is located in a same pixel row, and in the second region, one pixel group of the pixel groups is located in a same pixel column;

in a direction from the angle bisector of the angle R toward the first tangent line, the first region comprises a first pixel group of the first region, a second pixel group of the first region to an $N^{th}$ pixel group of the first region arranged sequentially, and in a direction from the angular bisector of the angle R to the second tangent line, the second region comprises a first pixel group of the second region, a second pixel group of the second region to an $N^{th}$ pixel group of the second region arranged sequentially; and in a direction from the profiled border toward the display region, aperture areas of the pixels in an $X^{th}$ pixel group of the first region and aperture areas of the pixels in an $X^{th}$ pixel group of the second region are the same, wherein X is greater than or equal to 1 and less than or equal to N, and N is a positive integer.

8. The profiled display panel according to claim 7, wherein the angle bisector of the angle R divides the angle R into a first angle with the first tangent line as an edge and a second angle with the second tangent line as an edge;

an angle bisector of the first angle divides the first region into a first sub-region close to the angular bisector of the angle R and a second sub-region close to the first tangent line, a number of the pixels adjacent to the profiled border in the pixel group in the second sub-region is greater than or equal to a number of the pixels adjacent to the profiled border in the pixel group in the first sub-region; and an angle bisector of the second angle divides the second region into a third sub-region close to the angular bisector of the angle R and a fourth sub-region close to the second tangent line, a number of the pixels adjacent to the profiled border in the pixel group in the fourth sub-region is greater than or equal to a number of the pixels adjacent to the profiled border in the pixel group in the third sub-region.

9. The profiled display panel according to claim 8, wherein:

the number of pixels adjacent to the profiled border in the pixel group in the first sub-region is less than or equal to 2, and a number of low-brightness pixels in a pixel group in the first sub-region is less than or equal to 2; and the number of pixels adjacent to the profiled border in the pixel group in the second sub-region is more than or equal to 2, and a number of low-brightness pixels in a pixel group in the second sub-region is more than or equal to 2.

10. The profiled display panel according to claim 9, wherein:
in each of the pixel groups of the second sub-region, the number of pixels adjacent to the profiled border is equal to the number of the low-brightness pixels.

11. The profiled display panel according to claim 1, wherein a difference of gray scale between the low-brightness pixels having different brightness is an integer multiple of 16.

12. The profiled display panel according to claim 1, wherein the pixel group comprises a first pixel group and a second pixel group, and a number of pixels adjacent to the profiled border in the first pixel group is greater than a number of pixels adjacent to the profiled border in the second pixel group, and a number of the low-brightness pixels in the first pixel group is greater than or equal to a number of the low-brightness pixels in the second pixel group.

13. A display device comprising a profiled display panel, wherein the profiled display panel comprises a display region having a profiled border,
the profiled display panel comprises a plurality of pixels comprising low-brightness pixels and regular pixels, and brightness of the low-brightness pixels is lower than brightness of the regular pixels under a same driving voltage, the plurality of pixels forms a plurality of pixel rows extending in a first direction and a plurality of pixel columns extending in a second direction, each of the pixel rows or the pixel columns comprises a pixel group comprising the low-brightness pixels at one end of the pixel group and the regular pixels at the other end of the pixel group, and the regular pixels are arranged away from the profiled border, wherein the first direction intersects with the second direction; and
wherein an aperture area of the low-brightness pixels in a same pixel group is gradually increased in a direction from the profiled border toward the display region,
each of the pixels comprises at least three sub-pixels having different colors arranged sequentially in the first direction; and
aperture areas of the sub-pixels of the same pixel are identical,
an aperture of the sub-pixel has a rectangular shape, and has a first and a second edge opposite of the first edge in the second direction, wherein in the second, the first edge is closer to the profiled border that the second edge; and
in a same pixel row, the first edges of the sub-pixels in each of the regular pixels are in a first straight line and the second edges of the sub-pixels in each of the regular pixels are in a second straight line, the first edge of the sub-pixels in at least one of the low-brightness pixels is not in the first straight line, and/or, the second edge of the sub-pixels in at least one of the low-brightness pixels is not in the second straight line,
the low-brightness pixel comprises a first low-brightness pixel and a second low-brightness pixel, wherein under a same driving voltage, brightness of the first low-brightness pixel is greater than 0 and less that a half of brightness of the regular pixel, and brightness of the second low-brightness pixel is greater that or equal to a half of the brightness of the regular pixel,
wherein in the first direction from the profiled border toward the display region:
when a slope of a curve at which the profiled border is located is more that zero, a distance between the first edges od the sub-pixels of the low-brightness pixel and the second straight line is increased sequentially; and
when a slope of the curve at which the profiled border is located is less then zero, the distance between the first edges of the sub-pixels of the second low-brightness pixel and the second straight line is reduced sequentially.

* * * * *